United States Patent
Fulford et al.

(10) Patent No.: US 11,171,208 B2
(45) Date of Patent: Nov. 9, 2021

(54) HIGH PERFORMANCE CIRCUIT APPLICATIONS USING STACKED 3D METAL LINES

(71) Applicant: Tokyo Electron Limited, Tokyo (JP)

(72) Inventors: H. Jim Fulford, Marianna, FL (US); Mark I. Gardner, Cedar Creek, TX (US); Anton J. Devilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/848,738

(22) Filed: Apr. 14, 2020

(65) Prior Publication Data

US 2021/0175327 A1  Jun. 10, 2021

Related U.S. Application Data

(60) Provisional application No. 62/944,941, filed on Dec. 6, 2019.

(51) Int. Cl.
| | |
|---|---|
| *H01L 29/06* | (2006.01) |
| *H01L 21/02* | (2006.01) |
| *H01L 21/822* | (2006.01) |
| *H01L 21/8239* | (2006.01) |

(52) U.S. Cl.
CPC ...... *H01L 29/0665* (2013.01); *H01L 21/0245* (2013.01); *H01L 21/0259* (2013.01); *H01L 21/02532* (2013.01); *H01L 21/8221* (2013.01); *H01L 21/8239* (2013.01)

(58) Field of Classification Search
CPC .......... H01L 21/0245; H01L 21/02532; H01L 21/0259; H01L 21/027; H01L 21/283; H01L 21/28506; H01L 21/31; H01L 21/311; H01L 21/3111; H01L 21/31144; H01L 21/32; H01L 21/3213; H01L 21/32139; H01L 21/467; H01L 21/469; H01L 21/475; H01L 21/8221; H01L 21/8239; H01L 29/0665; H01L 29/0669; H01L 29/0673; H01L 21/02603; H01L 27/0688; H01L 29/66469; H01L 29/775
See application file for complete search history.

(56) References Cited

U.S. PATENT DOCUMENTS

| | | | |
|---|---|---|---|
| 9,515,138 B1 * | 12/2016 | Doris | H01L 21/02532 |
| 2019/0097011 A1 * | 3/2019 | Wu | H01L 27/092 |
| 2019/0131394 A1 * | 5/2019 | Reznicek | H01L 29/775 |
| 2020/0105751 A1 * | 4/2020 | Dewey | B82Y 10/00 |
| 2020/0118892 A1 * | 4/2020 | Cheng | H01L 21/845 |
| 2020/0403034 A1 * | 12/2020 | Ando | G06N 3/063 |

* cited by examiner

*Primary Examiner* — David C Spalla
(74) *Attorney, Agent, or Firm* — Oblon, McClelland, Maier & Neustadt, L.L.P.

(57) ABSTRACT

Transistor/semiconductor devices and methods of forming transistor/semiconductor devices. The devices include a metal layer with dielectric isolation within existing 3D silicon stacks. Two different disposable materials within the 3D silicon stack are selectively removed later from other layers in the stack to become future metal layers and oxide layer respectively, to provide the metal line isolated in a vertical central portion of the stack.

18 Claims, 24 Drawing Sheets

HIGH PERFORMANCE CIRCUIT APPLICATIONS USING STACKED 3D METAL LINES

CROSS REFERENCE TO RELATED APPLICATIONS

This application is based on and claims the benefit of and priority to U.S. Provisional Patent Application No. 62/944,941, entitled "HIGH PERFORMANCE CIRCUIT APPLICATIONS USING STACKED 3D METAL LINES", filed on Dec. 6, 2019, the entire contents of which are herein incorporated by reference.

BACKGROUND

Technical Field

This disclosure relates to integrated circuits and the fabrication of microelectronic devices, including semiconductor devices, transistors and integrated circuits. More particularly, it relates to manufacturing of three-dimensional (3D) semiconductor devices.

Description of the Related Art

In the manufacturing of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for 3D semiconductor circuits in which transistors are stacked on top of each other.

3D integration is seen as a viable option to continue semiconductor scaling in spite of inevitable saturation in critical dimension scaling. As the contacted gate pitch reaches its scaling limit due to manufacturing variability and electrostatic device limitations, two-dimensional transistor density scaling stops. Even experimental new transistor designs, such as vertical channel gate-all-around transistors, that may be able to one day overcome these contacted gate pitch scaling limits, do not promise to get semiconductor scaling back on track because resistance, capacitance, and reliability concerns limit wire pitch scaling, thereby limiting the density with which transistors can be wired into circuits.

3D integration, i.e. the vertical stacking of multiple devices, aims to overcome these scaling limitations by increasing transistor density in volume rather than area. Device stacking has been successfully demonstrated and implemented by the flash memory industry with the adoption of 3D NAND. Mainstream CMOS VLSI scaling, as used for example in CPU (central processing unit) or GPU (graphics processing unit) products, is exploring adoption of 3D integration as a primary means of moving the semiconductor roadmap forward, and thus desires enabling technologies.

SUMMARY

Techniques herein include methods of making 3D transistors with integrated metal lines contained in the stack.

The fabrication flow herein allows for a central metal line to be isolated with a dielectric within a self-contained 3D silicon and 3D Metal Layout Network. Such techniques provide scaling of circuits. For example, 3D metal routing can be directed through a 3D transistor stack. The description focuses on showing one-metal connection lines as an example in place of 3aD epi nano-stack. Note, however, that N metal lines are possible. Such techniques provide significant savings.

Techniques herein provide transistor/semiconductor devices and methods of forming transistor/semiconductor devices to make a metal layer with dielectric isolation within existing 3D silicon stacks. This device and method enables higher 3D density circuits to be produced at reduced cost. In one example embodiment, a process flow uses two "disposable" epi layers to form an insulated metal line in the center of the nano-stack. In another example embodiment, a process flow uses two disposable epi layers to form an insulated metal line in the center of a nano-stack, but with a reduced need of Ru metal for the metal line.

The order of discussion of the different steps as described herein has been presented for clarity sake. In general, these steps can be performed in any suitable order. Additionally, although each of the different features, techniques, configurations, etc., herein may be discussed in different places of this disclosure, it is intended that each of the concepts can be executed independently of each other or in combination with each other. Accordingly, the present application can be embodied and viewed in many different ways.

This summary section does not specify every embodiment and/or incrementally novel aspect of the present application. Instead, this summary only provides a preliminary discussion of different embodiments and corresponding points of novelty over conventional techniques. Additional details and/or possible perspectives of the disclosed embodiments are described in the Detailed Description section and corresponding Figures of the present disclosure as further discussed below.

BRIEF DESCRIPTION OF THE DRAWINGS

The application will be better understood in light of the description which is given in a non-limiting manner, accompanied by the attached drawings in which:

FIGS. 7-24 show a process flow for forming 3D metal lines within a nano-stack in a second embodiment.

DETAILED DESCRIPTION OF THE PREFERRED EMBODIMENTS

Techniques herein provide transistor/semiconductor devices and methods of forming transistor/semiconductor devices. They include techniques for metal routing and connections for 3D logic and memory. Metal routing and connections for 3D logic and memory is a difficult issue to resolve to make multiple metal connections. Techniques herein solve this issue by providing a method to make a metal layer with dielectric isolation within existing 3D silicon stacks. This device and method enables higher 3D density circuits to be produced at reduced cost. Having a metal line contained within a 3D nano-sheet enables easier connections for 3D logic and memory. This also provides better speed performance because there is less distance for a signal to travel for a given transistor connection. In one example embodiment, a process flow uses two "disposable" epi layers to form an insulated metal line in the center of the nano-stack. In another example embodiment, a process flow uses two disposable epi layers to form an insulated metal line in the center of a nano-stack, but with reduced need of Ru metal.

Referring now to the Figures, a process flow is shown that uses SiX4 and SiX5 disposable epitaxial nano-sheets to form an insulated metal line in the center of a nano-stack.

Figure 1:
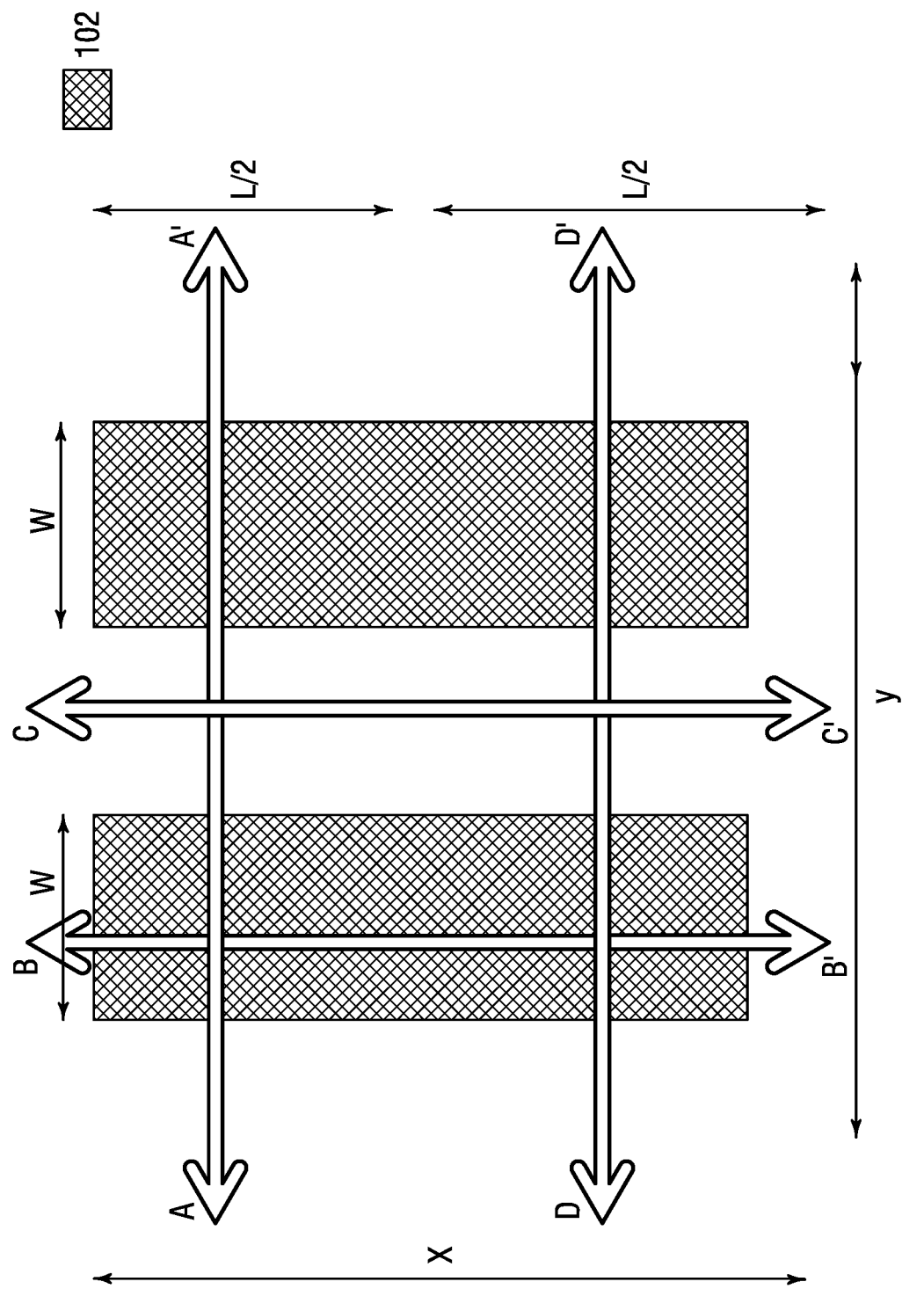
FIG. 1 shows a top view of a nano-stack before the fabrication of the 3D metal lines.

In FIGS. 1-24, non-limiting examples of the various layers of the stacks are as follows. 102: nitride cap
  103: SiX4
  104: SiX5
  105: Silicon channel
  106: $SiGe_2$ to be removed
  107: oxide
  108: substrate
  109: photoresist
  110: Ru or other metal FIG. 1 shows a top view of an example substrate segment. Two nano-sheet stacks are shown with dimensions W (width) and L (length). Note that L is not transistor length but length of the nano-sheet stack. A silicon nitride cap on top of the nano-sheet stack defines the nano-sheet stack dimensions. A nano-sheet stack is a stack or a set of layers of material formed by epitaxial growth. Epitaxial growth is conventionally known. Various semiconductor materials can be grown including different compounds, doping profiles and crystal orientations. The nano-sheet stack is formed into an elongated structure, for example, along Y axis, or into a fin-shaped stack.

Figure 2:
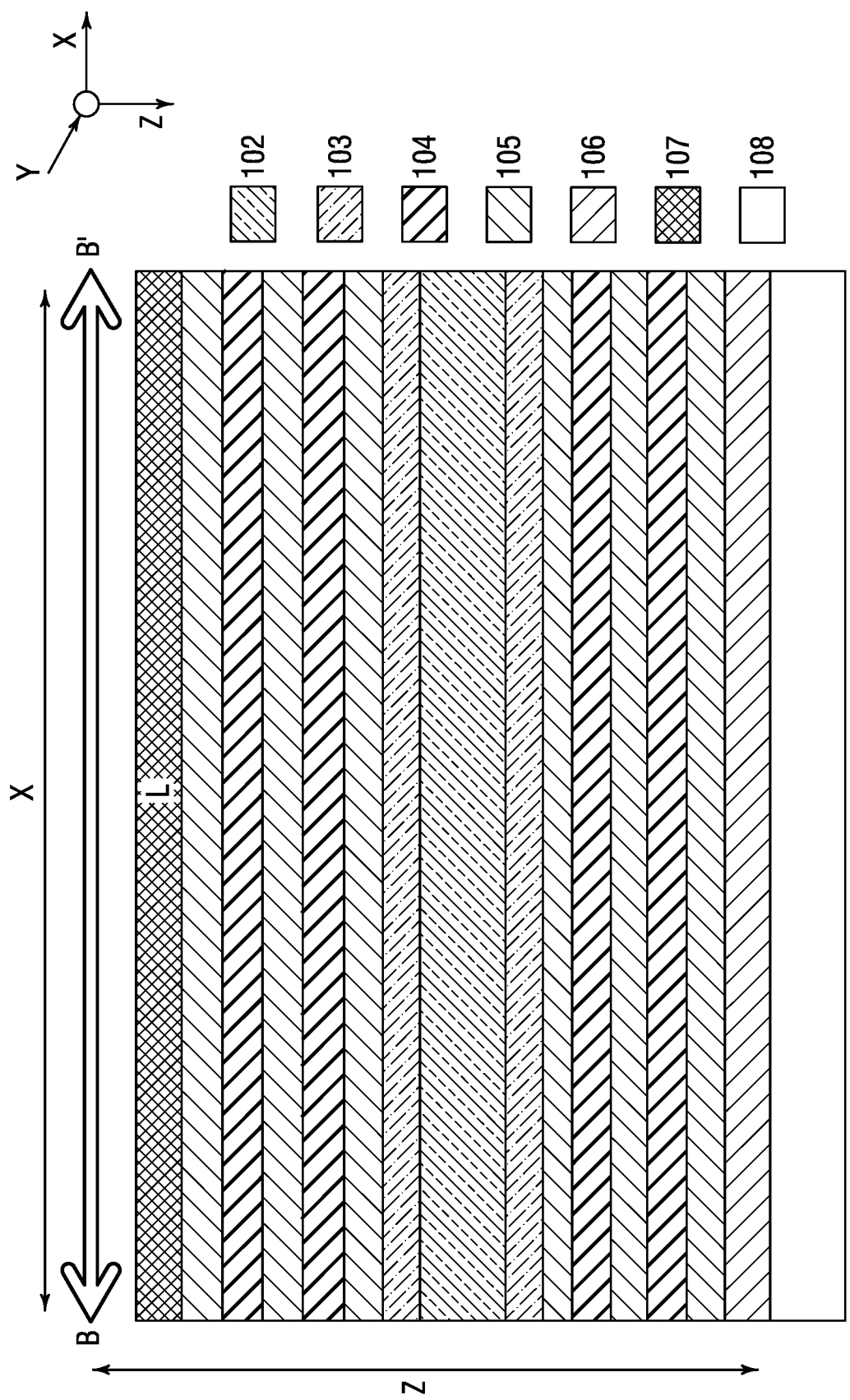
FIG. 2 shows a cross-sectional view of a nano-stack along X axis before the fabrication of the 3D metal lines.

FIG. 2 shows a side cross-sectional view of a nano-sheet stack. First, a nano-sheet stack is formed on substrate 108. For example, various layers are epitaxially grown. Stack layers can be grown with different variations of silicon. The SiX4 and SiX5 materials are interchangeable, but once one is fixed the other would have different etch selectivity. This is typically a different chemical compound, but can also comprise different orientations of a same compound. For example, materials for SiX4 and SiX5 may include $Si_xGe_y$ with x being 0.10 to 0.25 and y ranging from 0.75 to 0.90. Other selectable compounds include pure germanium, $Ge_xSn_y$, $Si_xC_y$, among others. After forming the layers of various compounds, an etch mask can be formed to directionally etch the stack, thus forming linear or fin-shaped structures (nano-sheet stacks). For example, etching can define the stack so that each layer has a generally rectangular shape and cross section. Alternatively, nanowires can be formed. Note that L in FIG. 2 is not channel length but length of a nano-sheet stack for illustration.

In this non-limiting embodiment, this example flow has one metal layer in the center of a 3D silicon plane nano-sheet stack. Also note only the edge of one nano-sheet stack is shown. SiX4 and SiX5 materials may be selectively removed later from other layers in the stack and to become future metal layers and oxide layer respectively. Additionally, GeX4 and GeX5 materials may also be used as layer material options. A given material in the nano-sheet stack can be etch selective relative to other materials, that is, being etched without etching remaining materials. Such etching for these materials is conventionally known. For example, a vapor-phase etching tool can be used to etch a given material by adjusting chemistry and etch parameters.

Figure 3:
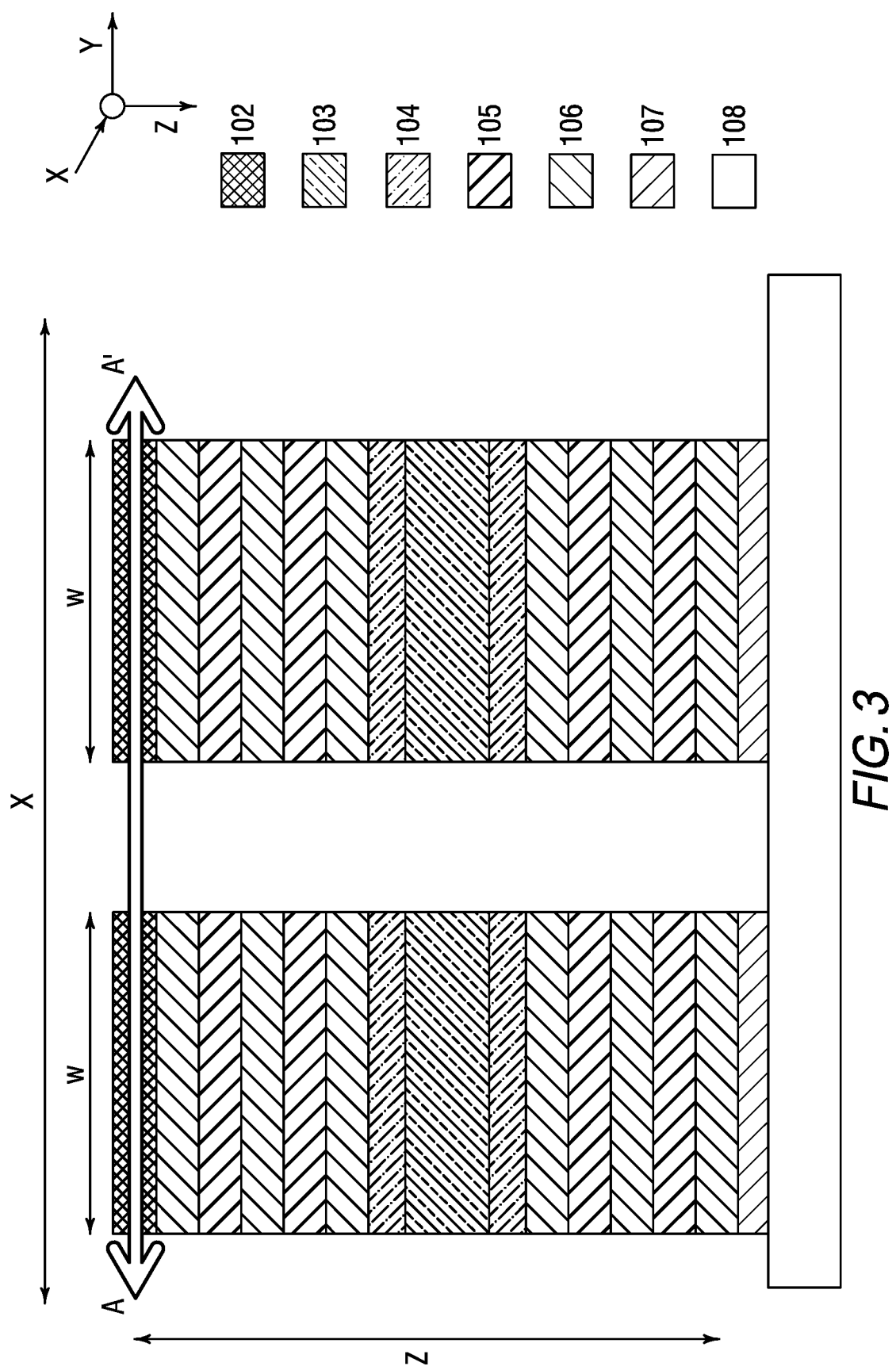
FIG. 3 shows a cross-sectional view of a nano-stack along Y axis before the fabrication of the 3D metal lines
Figure 4:
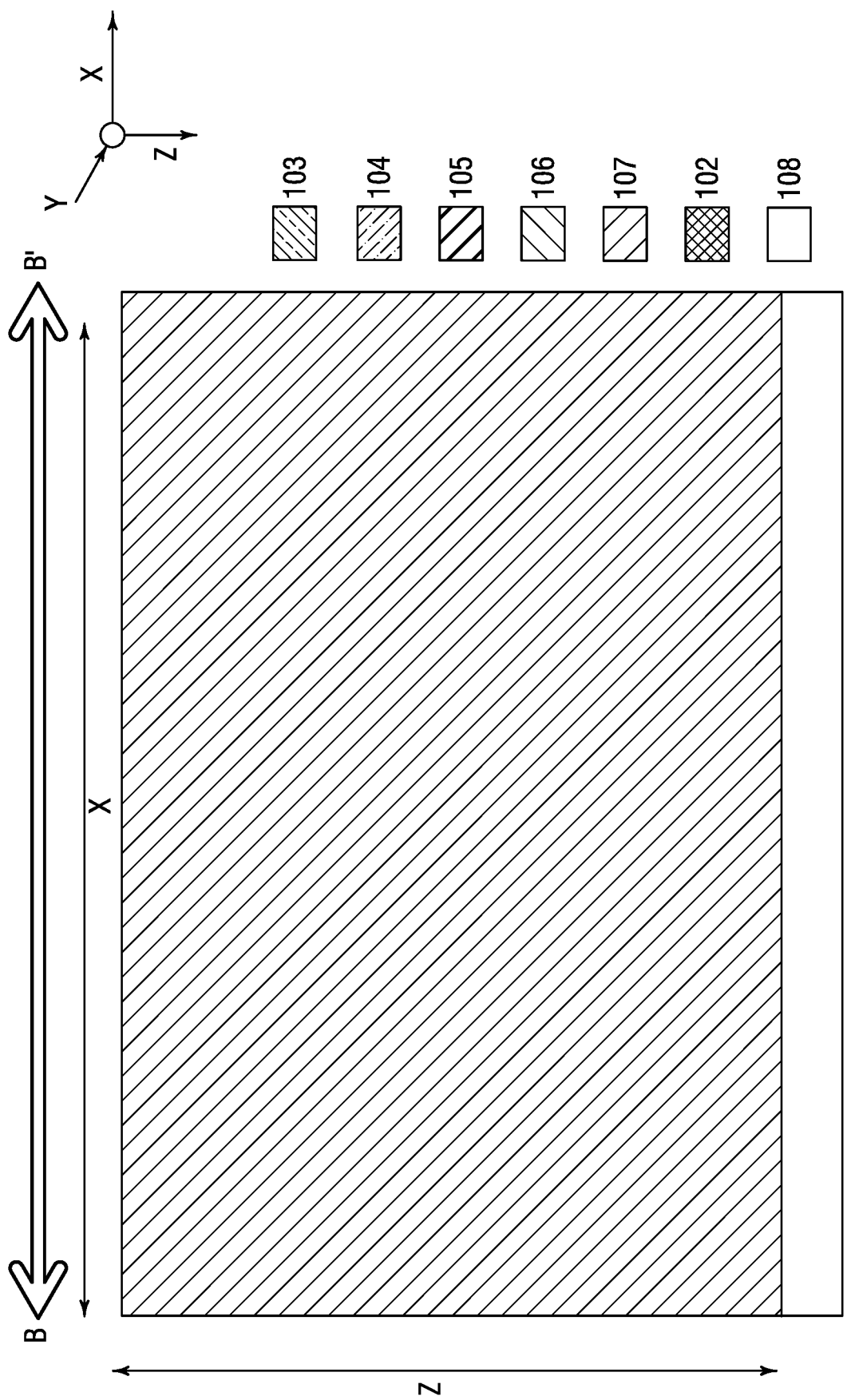
FIG. 4 shows a cross-sectional view of a nano-stack along X axis and along C-C' line before the fabrication of the 3D metal lines.

FIG. 3 shows a front view of the substrate segment (rotated 90 degrees relative to FIG. 2) showing two nano-sheet stacks. This example flow will have one metal layer contained within the center of a 3D silicon plane nano-sheet stack.

Figure 5:
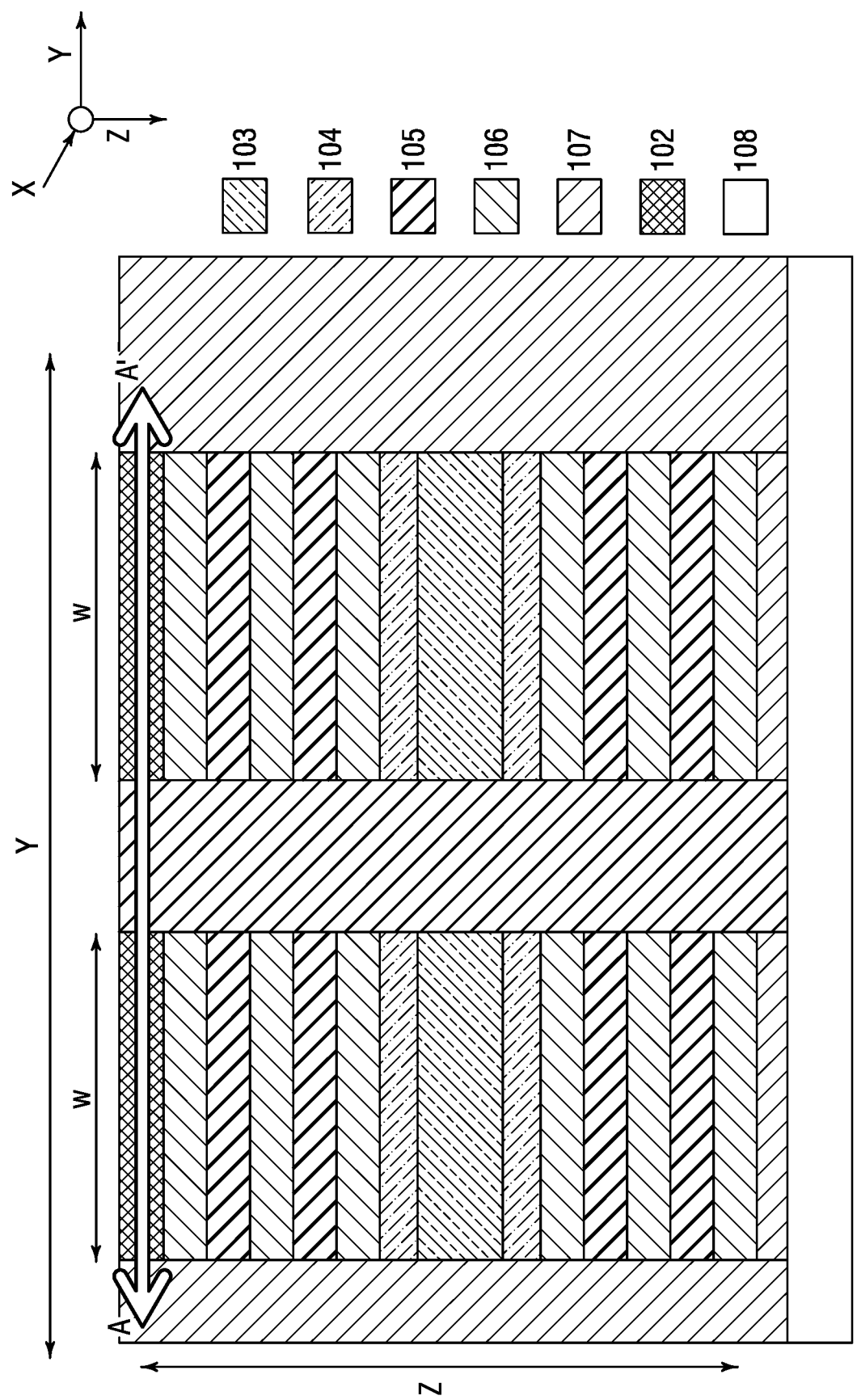
FIG. 5 shows a cross-sectional view of a nano-stack along Y axis and along the A-A' line before the fabrication of the 3D metal lines.

First, a dielectric, such as silicon dioxide (oxide), is deposited on the substrate 108. Oxide deposition and chemical-mechanical polishing (CMP) for planarization can be executed. This covers all the nano-sheet stacks in all x, y, and z directions along the C-C' line (FIG. 4) and along the A-A' line (FIG. 5).

Figure 6:
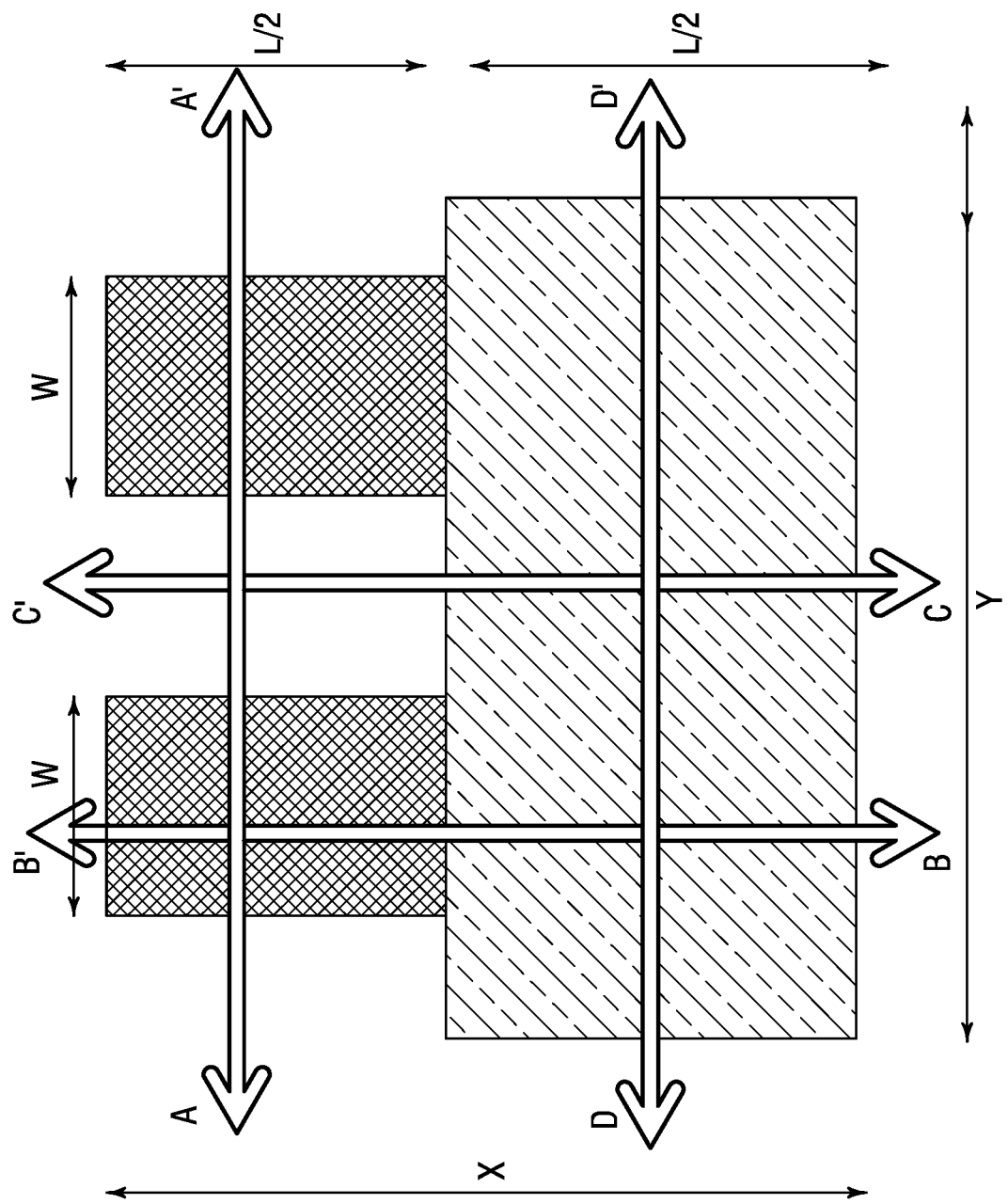
FIGS. 6-16 show a process flow for forming 3D metal lines within a nano-stack.
Figure 7:
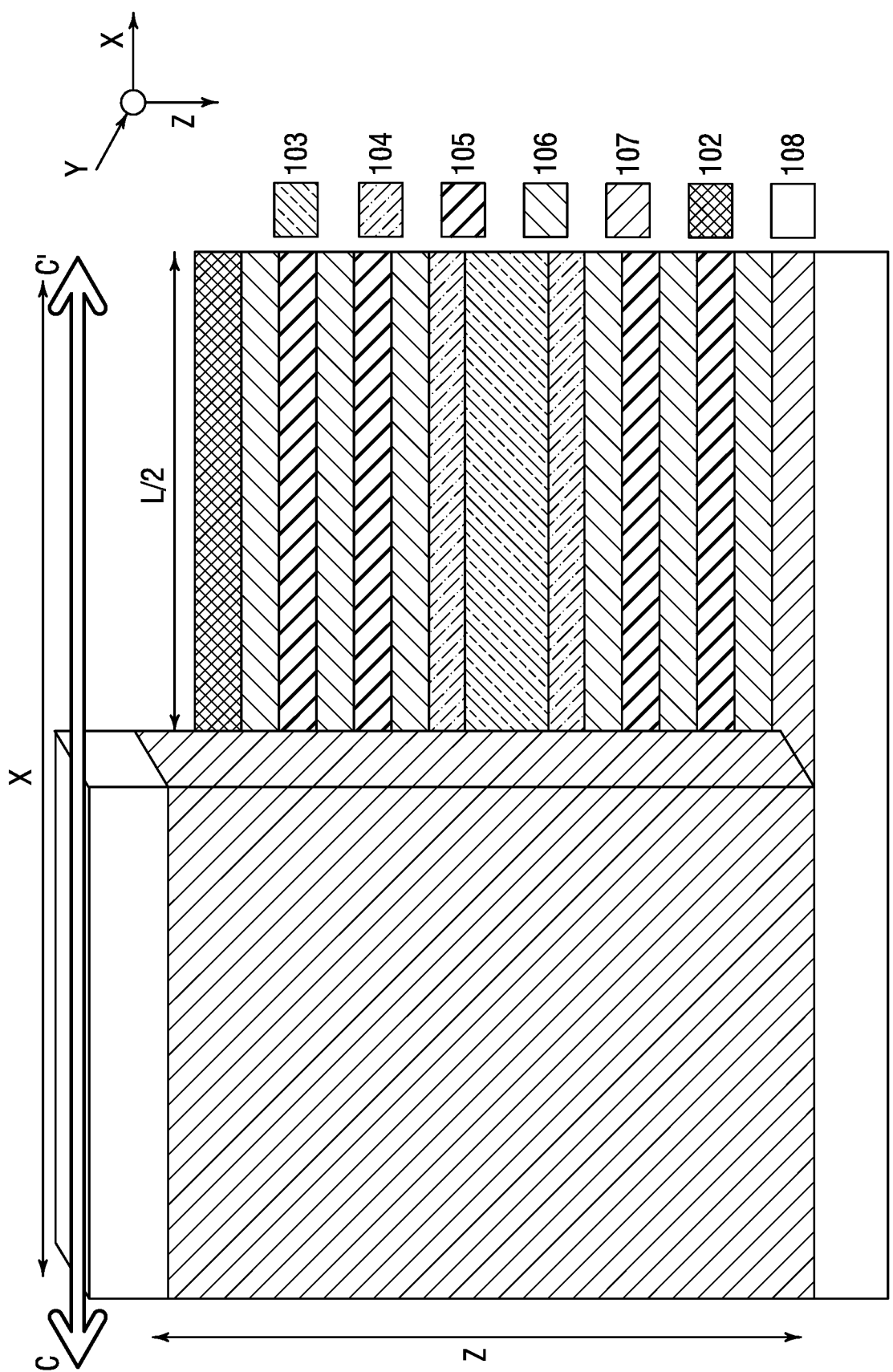
Figure 8:
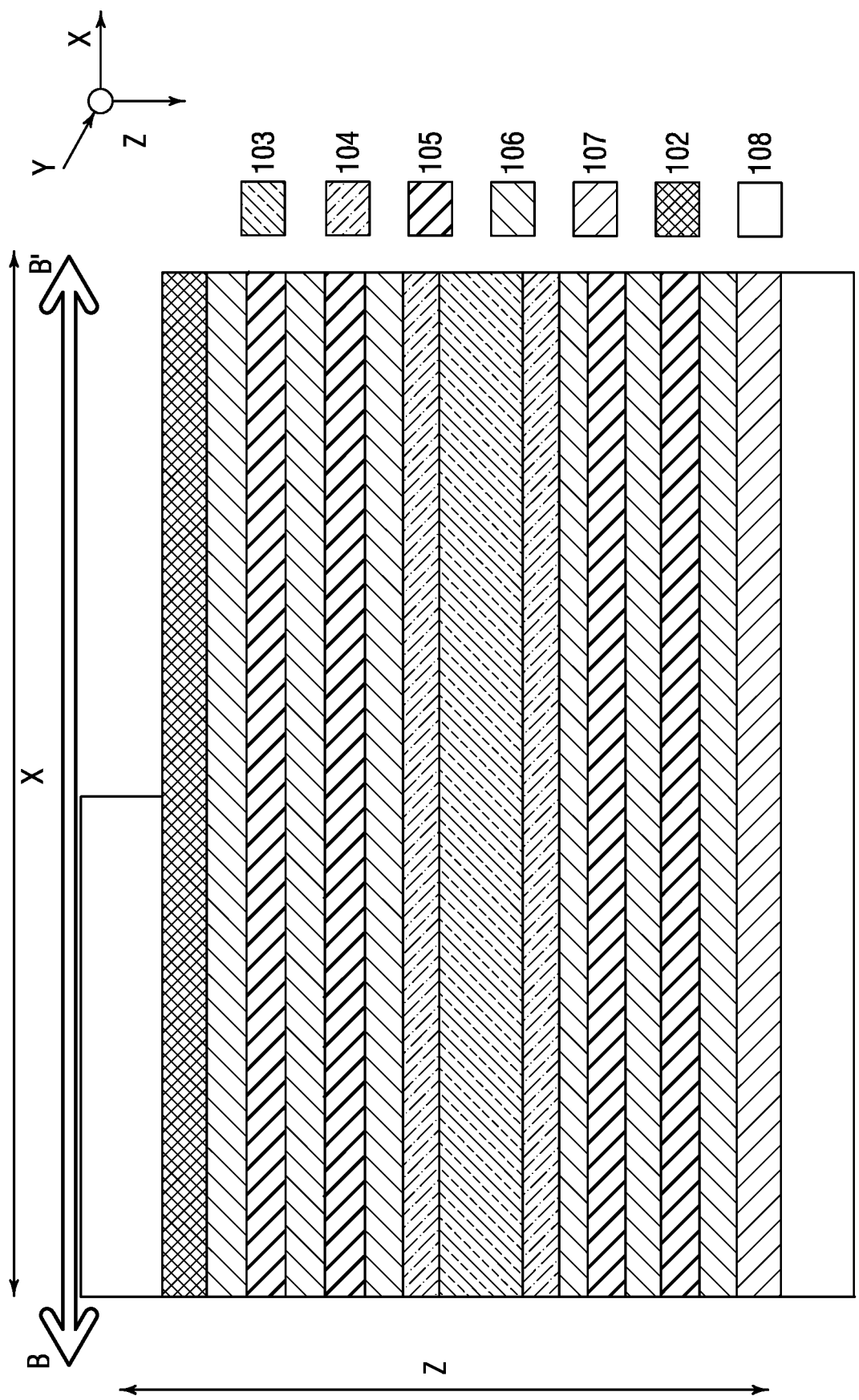
Figure 9:
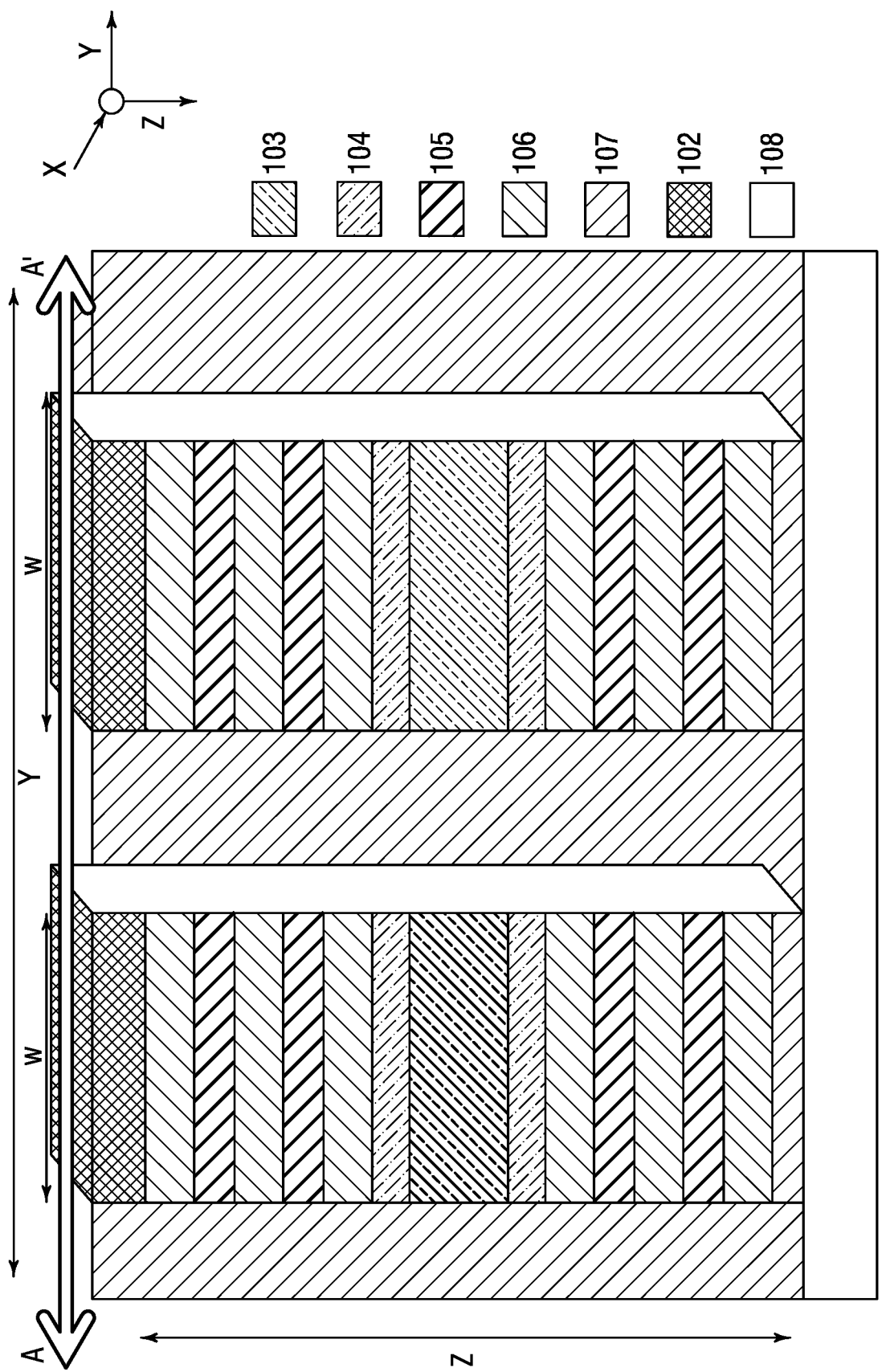
Figure 10:
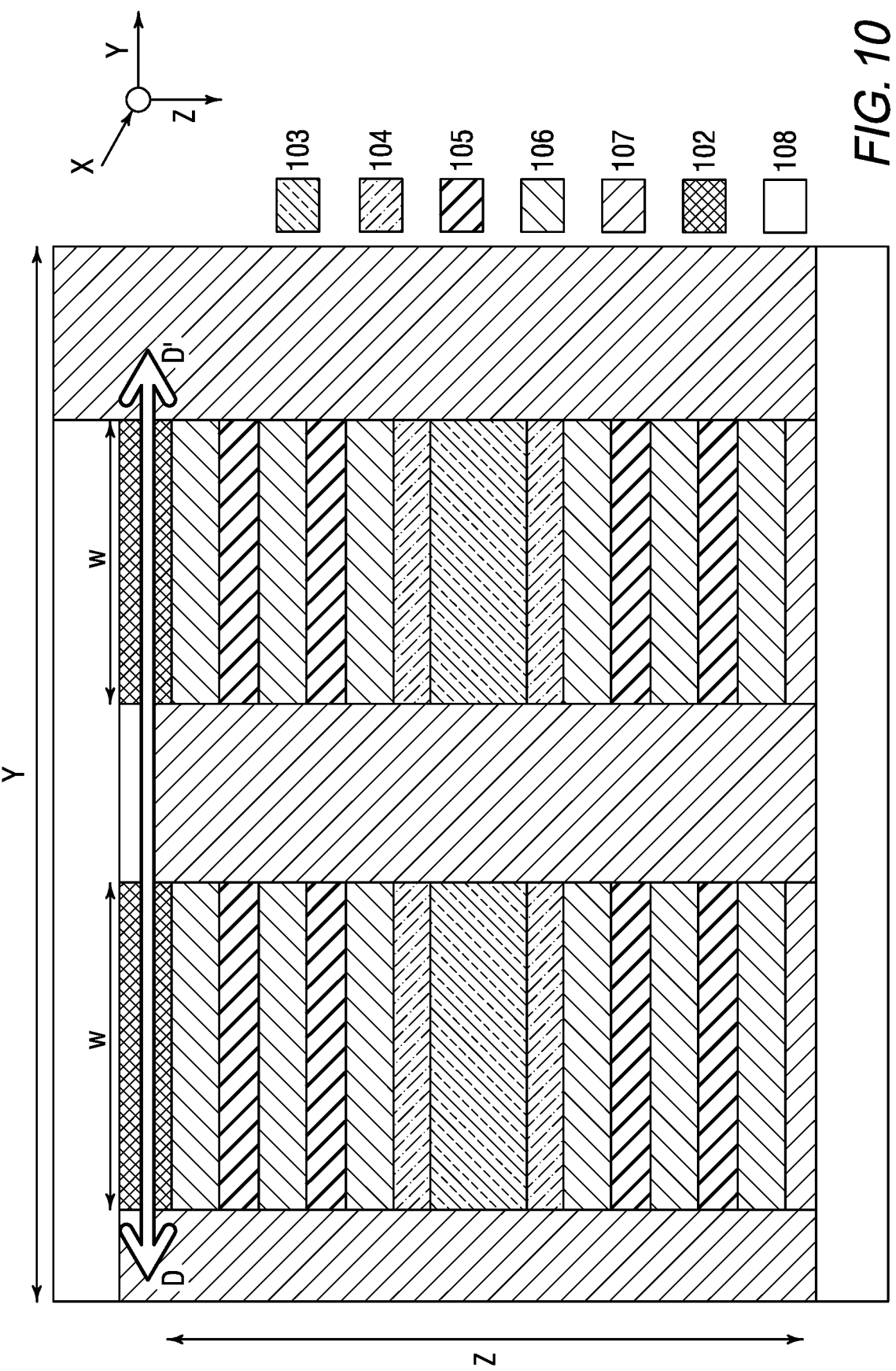

Next, an etch mask is formed on the substrate to cover a portion of the nano-sheet stacks. FIG. 6 shows a top view of a photoresist 109 etch mask on the oxide covered stacks. A directional/anisotropic etch step is executed that removes the oxide on uncovered stacks. Sidewalls of these stacks are now uncovered/exposed on the sides. This etch mask can be replicated to integrate x direction long spans. FIG. 7 shows a side view and FIG. 8 shows a side view under a different perspective. FIG. 9 shows a side view along the A-A' line with recessed oxide sections. The etch opens up one region/portion of the two stacks. The nitride allows edges of the stack to be revealed on one side. FIG. 10 shows a side view along the D-D' line with portion of oxide covered by the etch mask.

Figure 11:
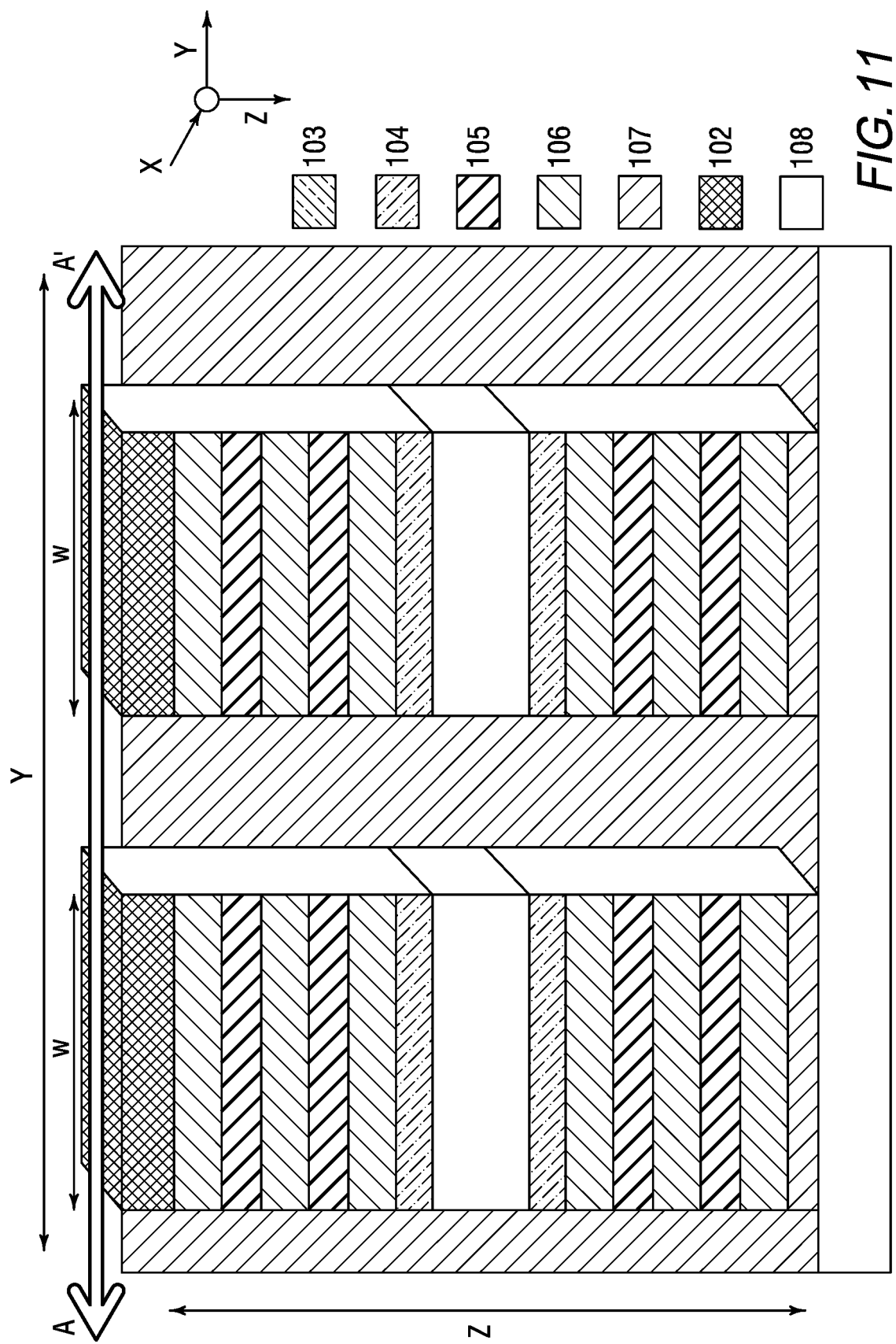
Figure 12:
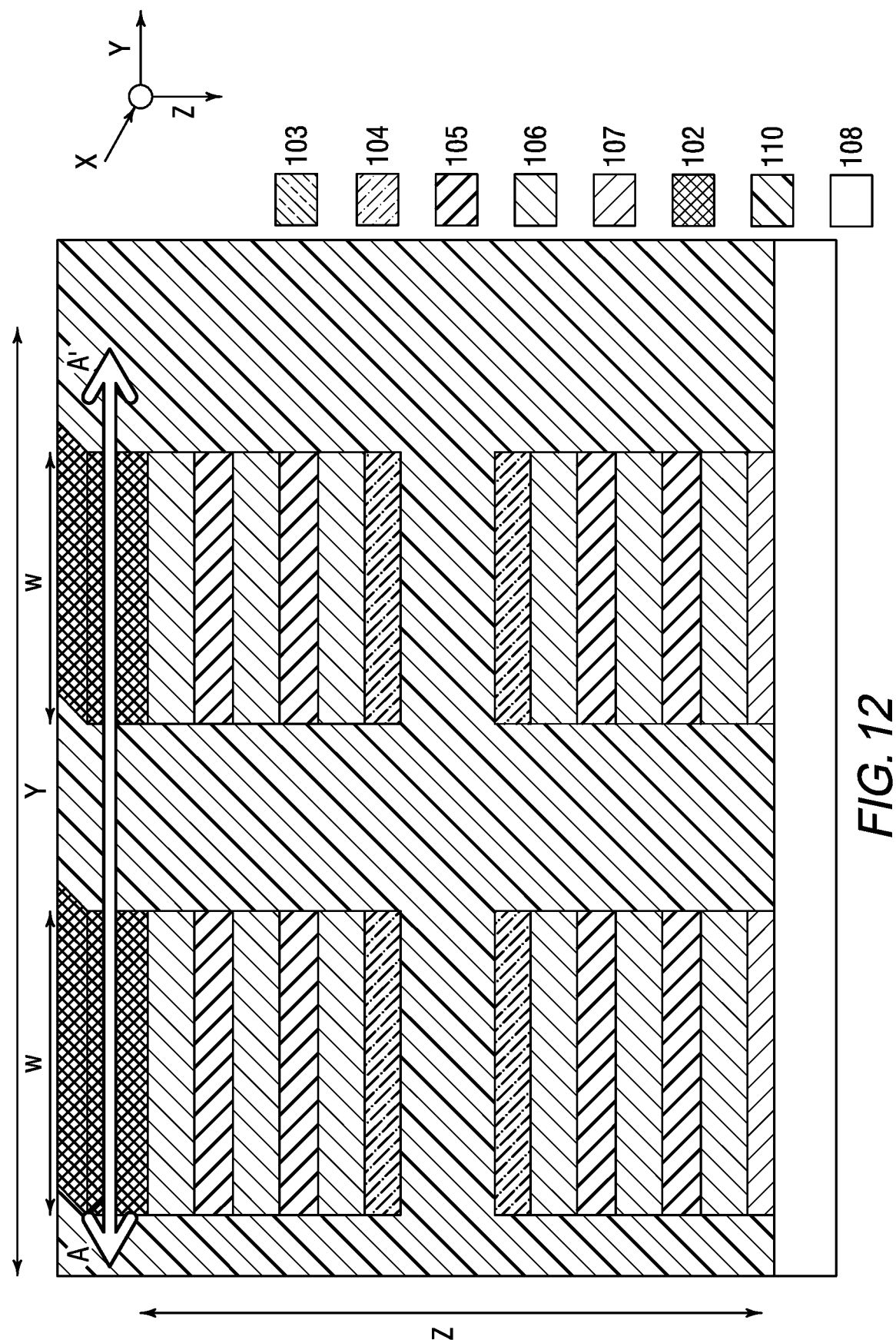
Figure 13:
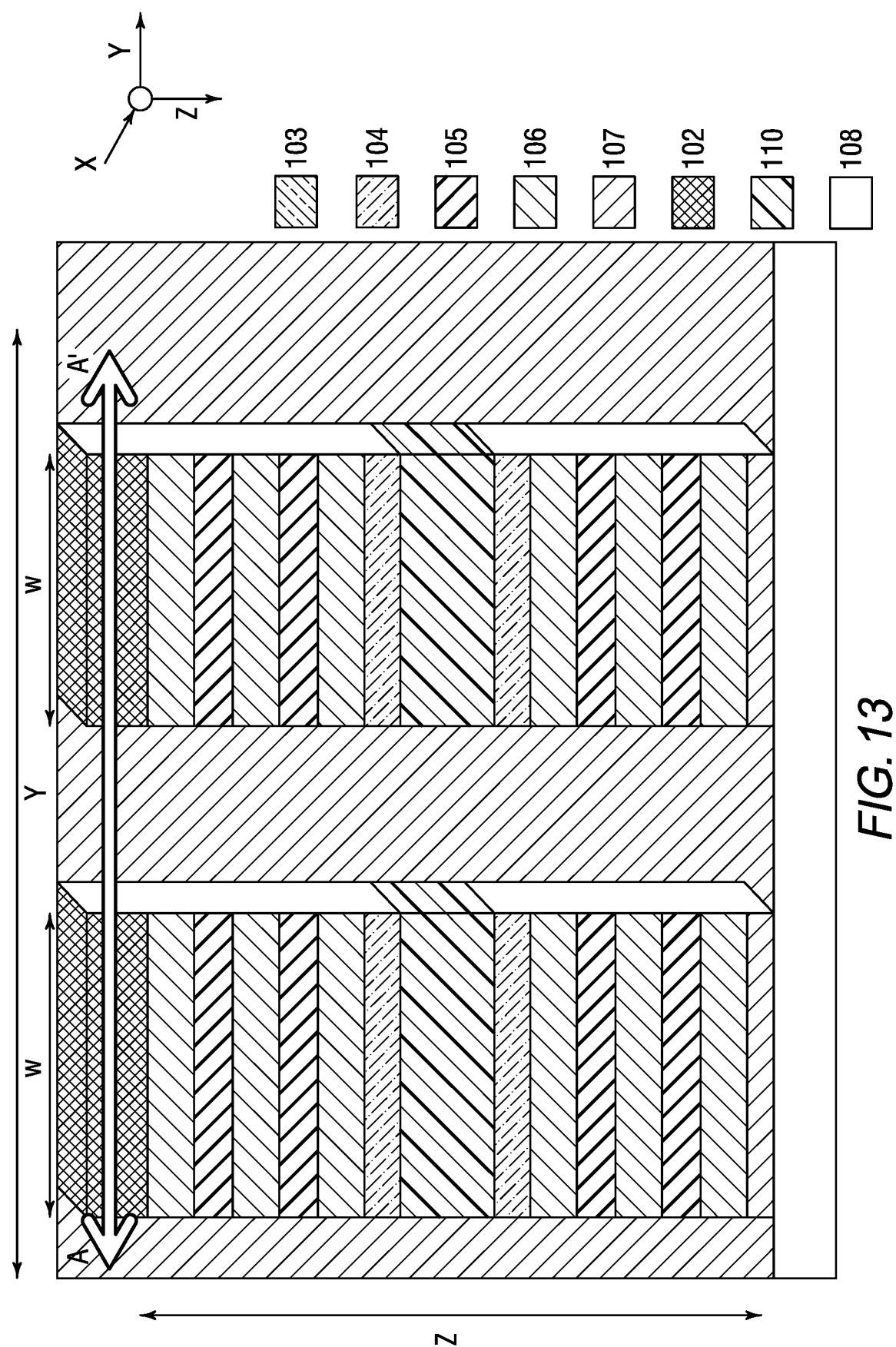

Next, SiX4 material is removed from uncovered portions of the stacks. An example result is shown in FIG. 11. The space previously occupied by the SiX4 is then replaced with a metal, such as ruthenium (Ru). FIG. 12 shows deposition of Ru filing the space in the stack as well as spaces between stacks and after CMP planarization. FIG. 13 shows the substrate segment after directional Ru etch to remove metal between stacks leaving metal in the space previously occupied by a SiX4 nano-sheet segment.

Figure 14:
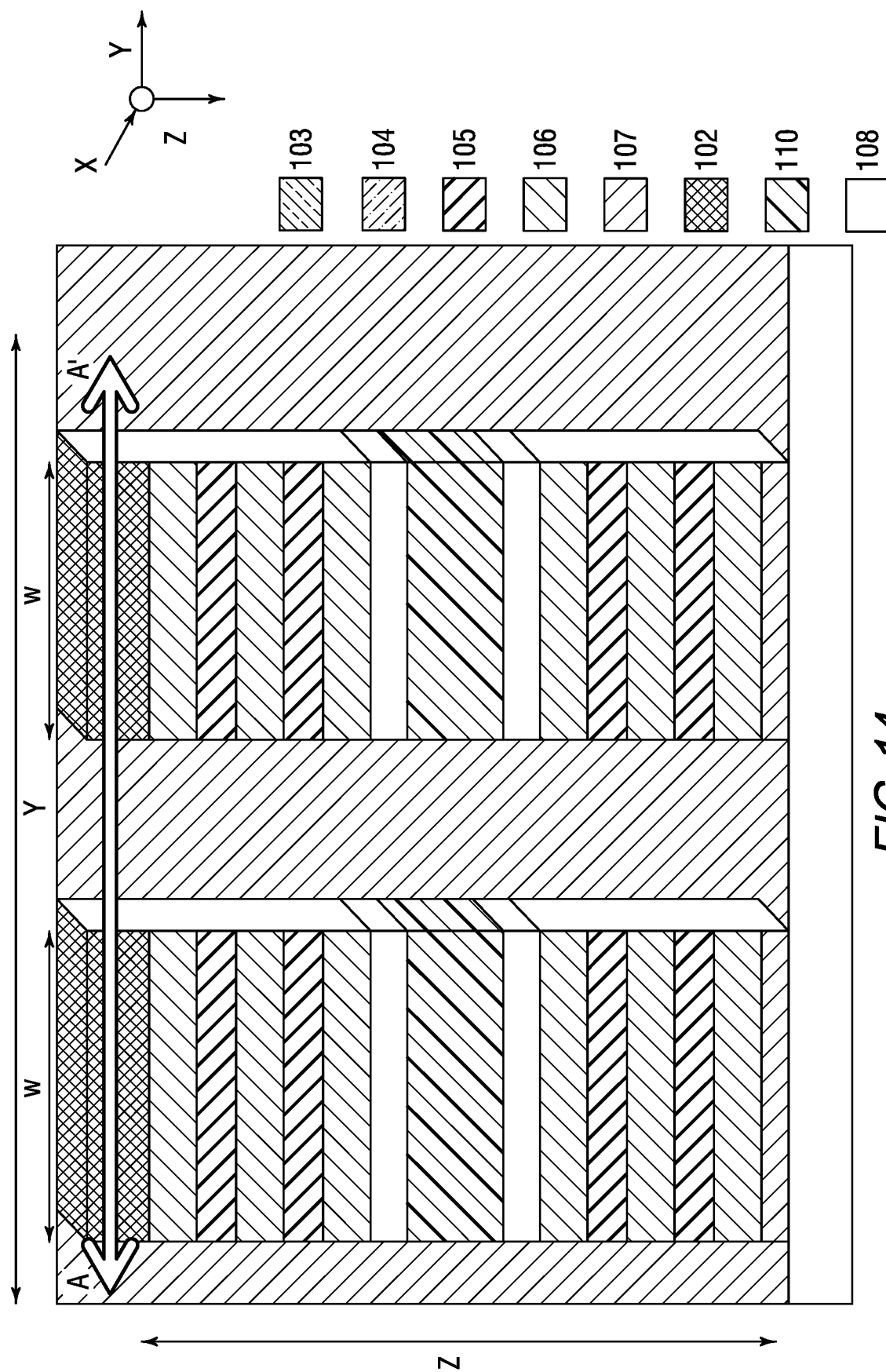
Figure 15:
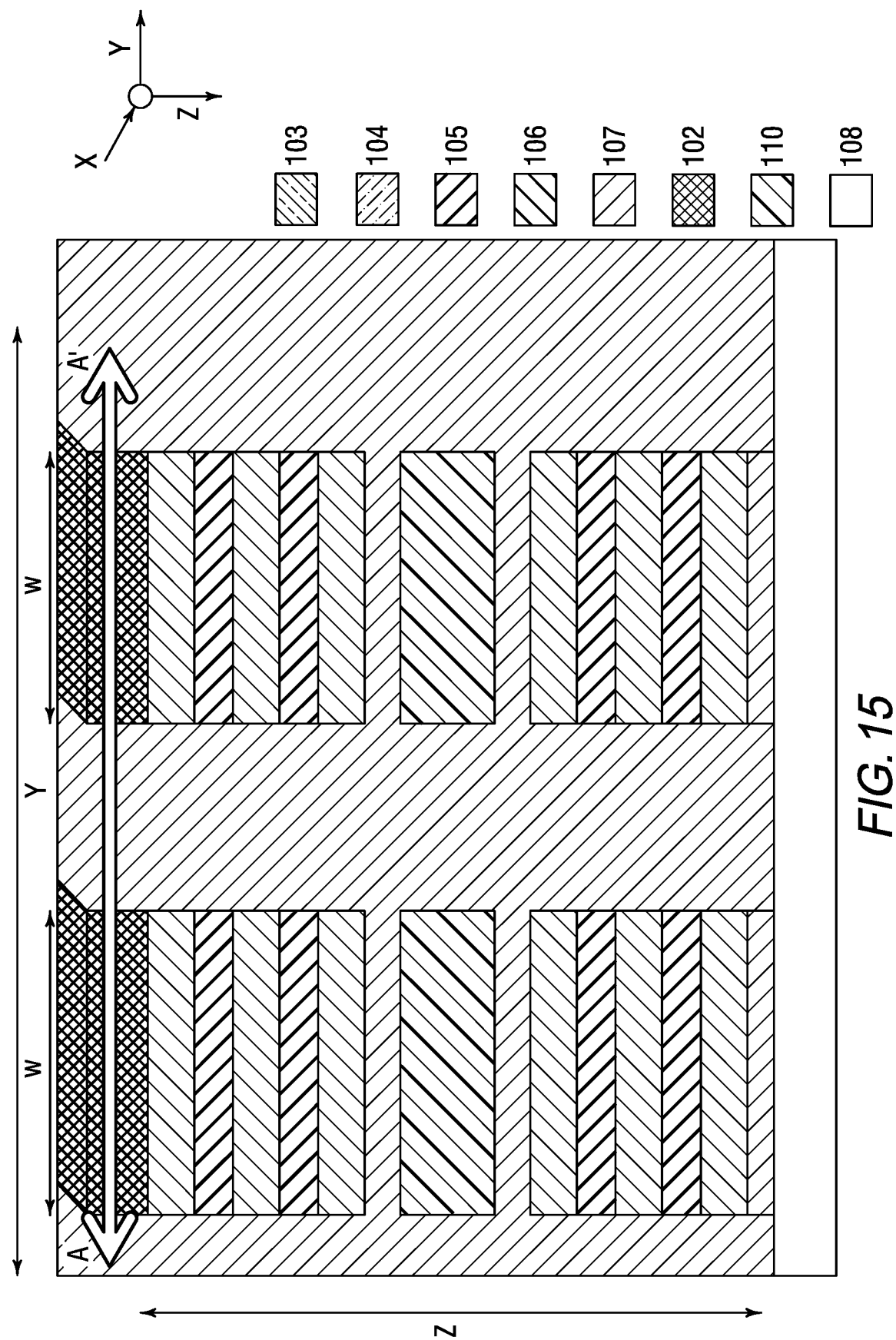
Figure 16:
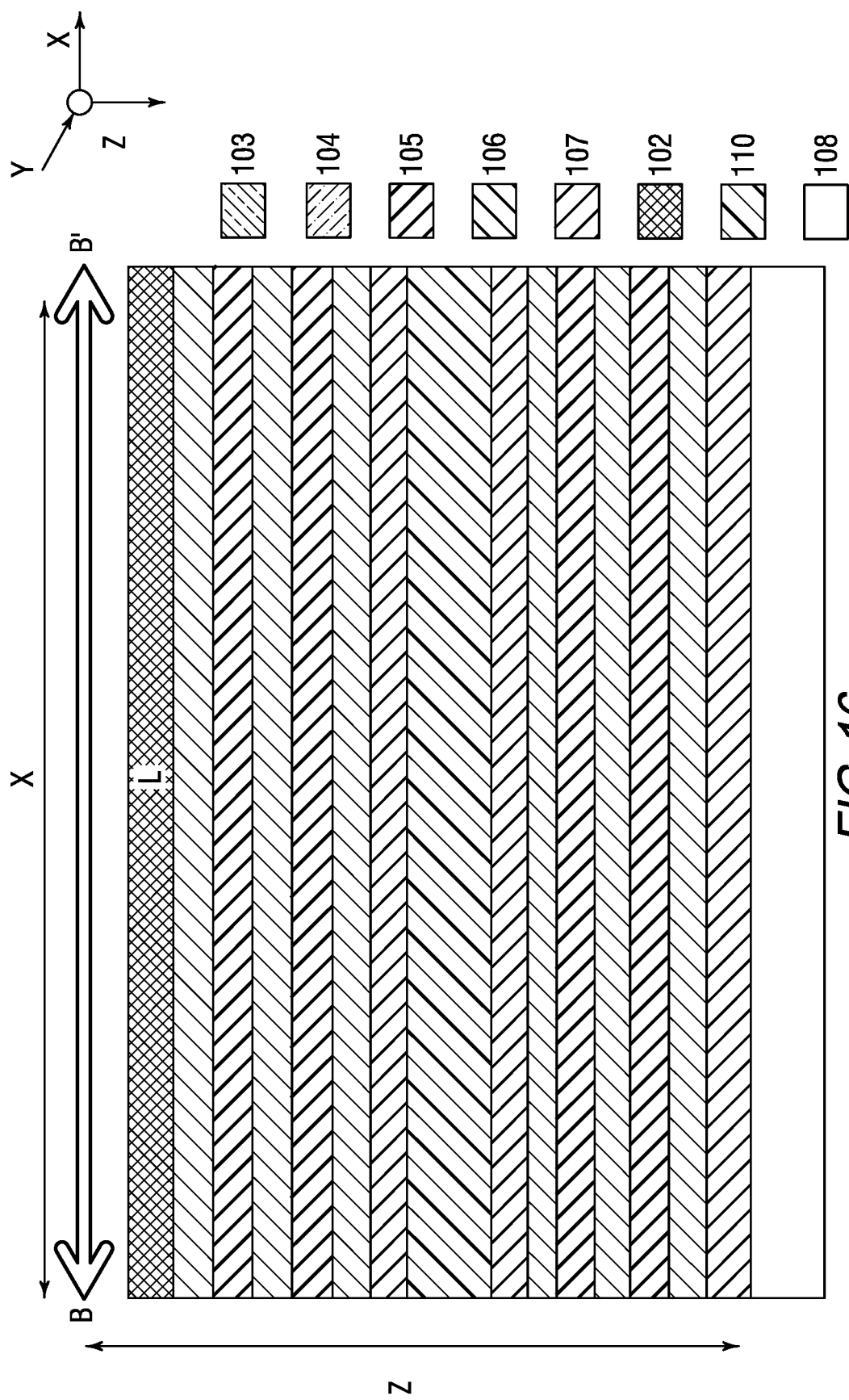
Figure 17:
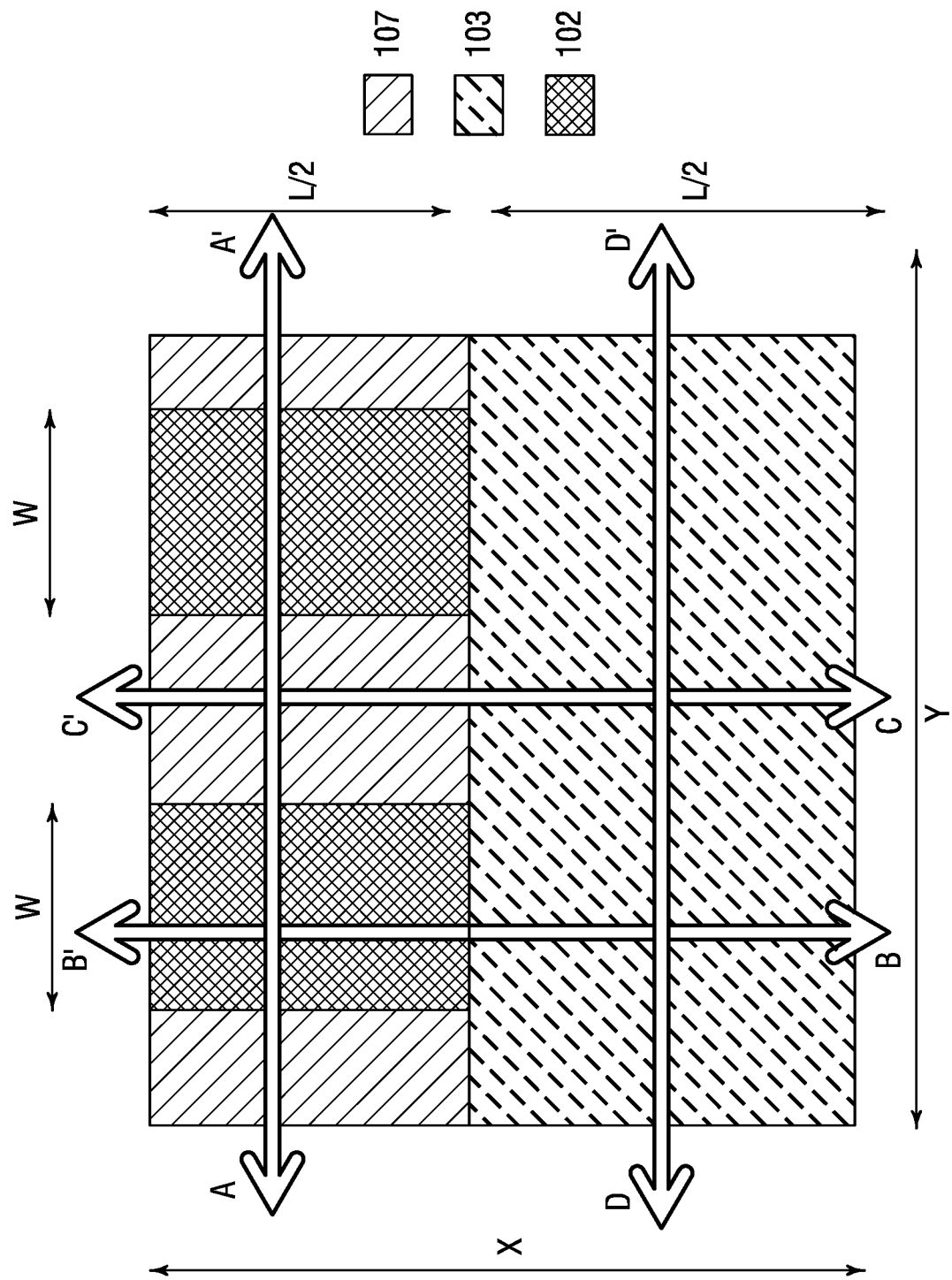
Figure 18:
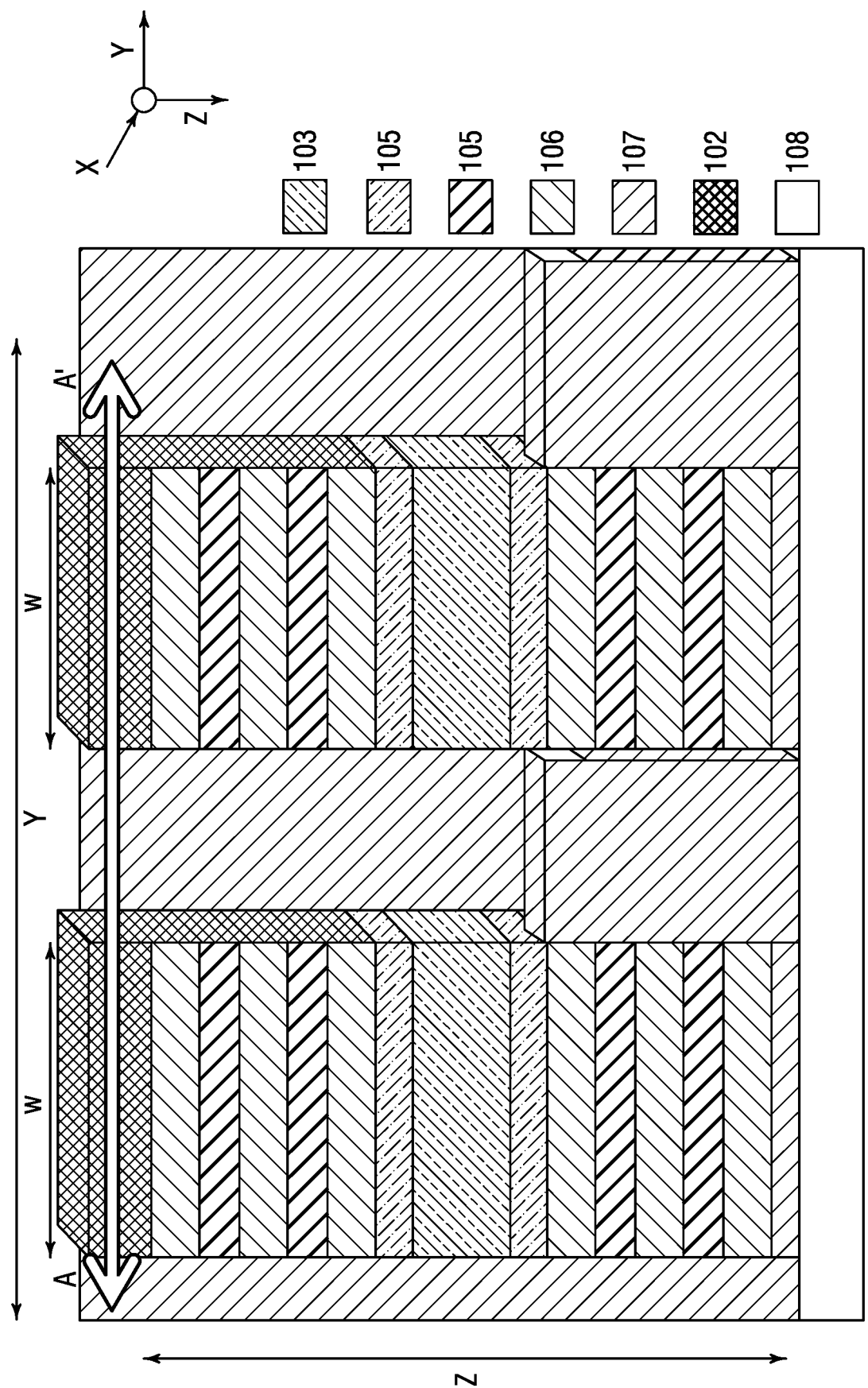
Figure 19:
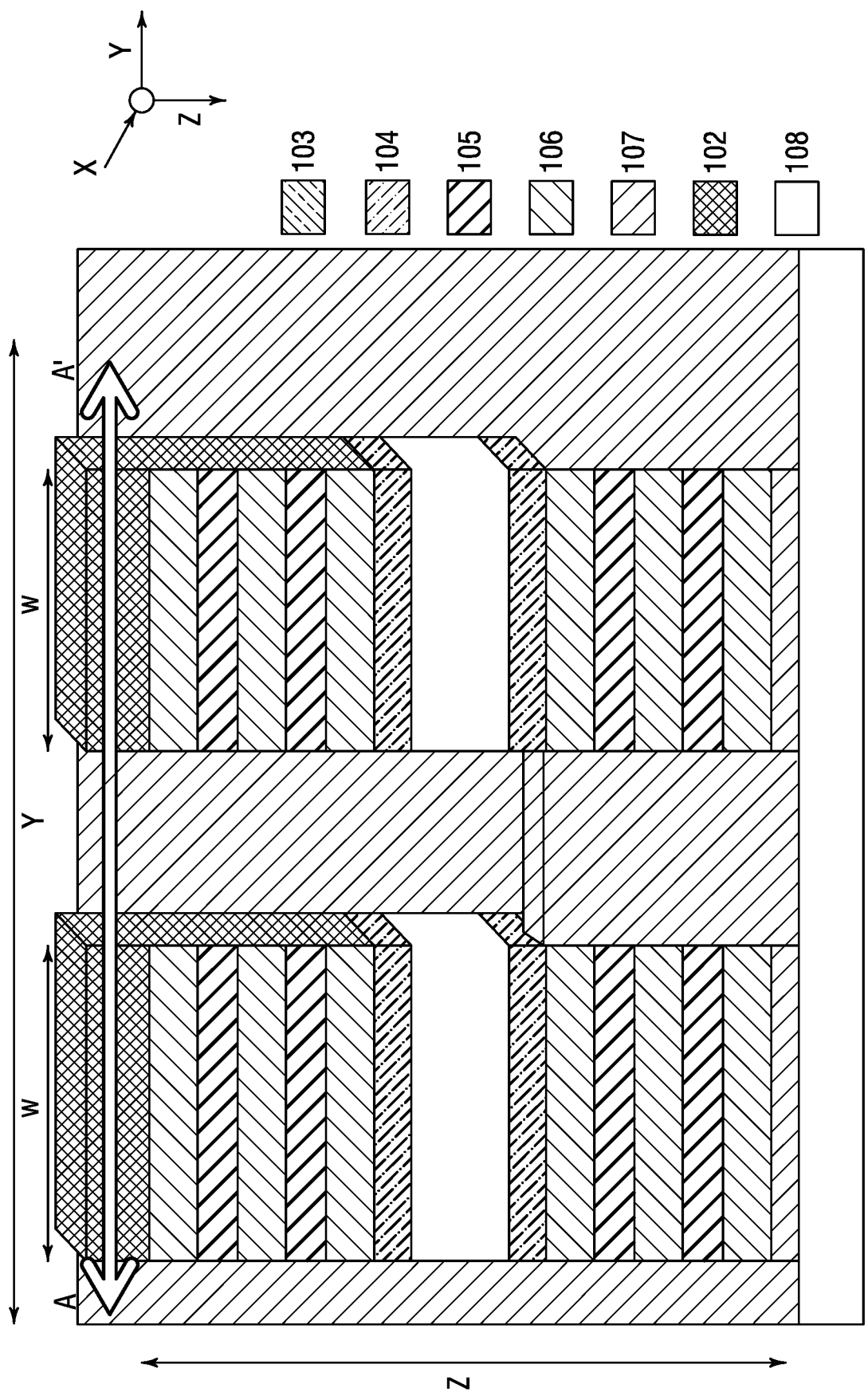
Figure 20:
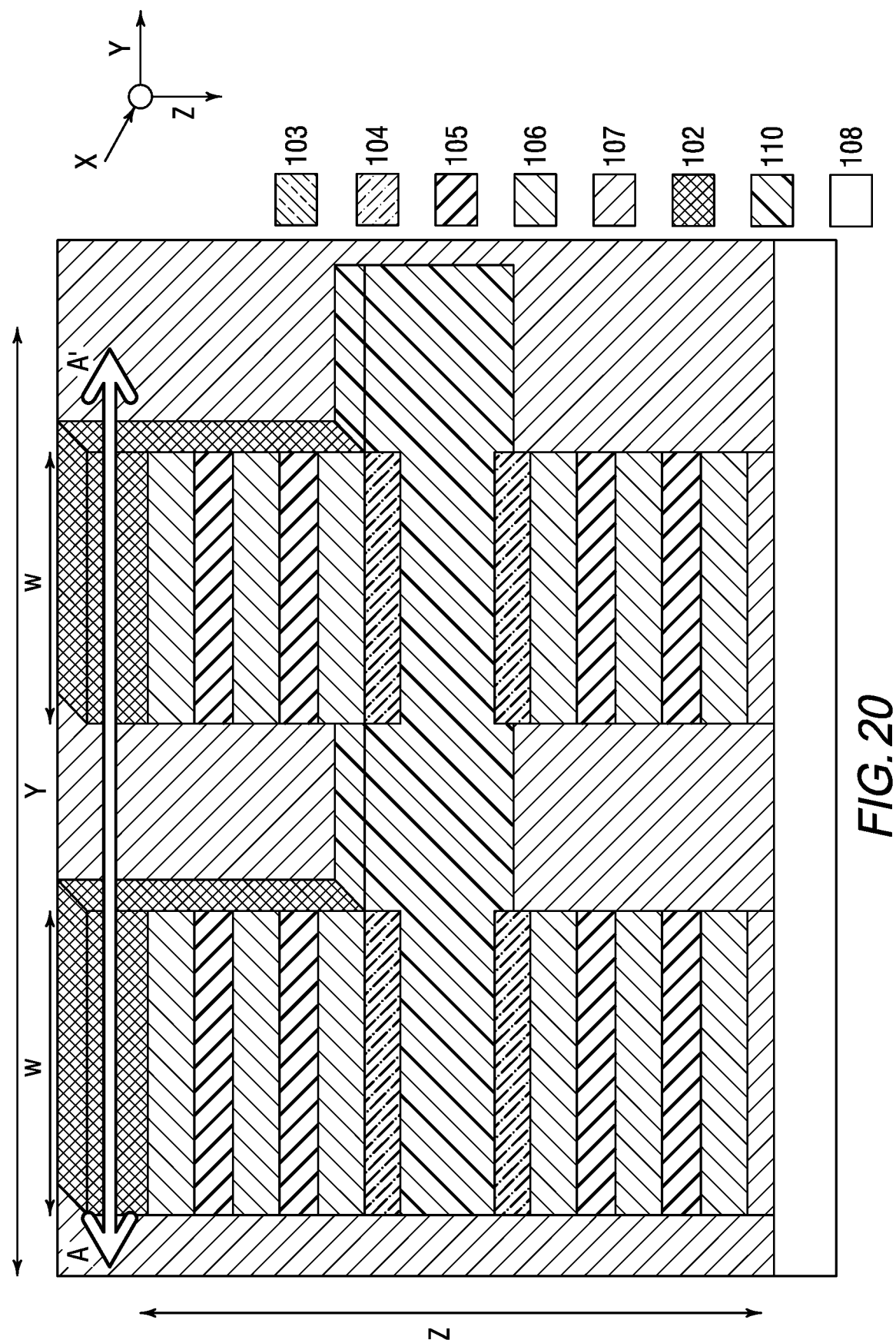
Figure 21:
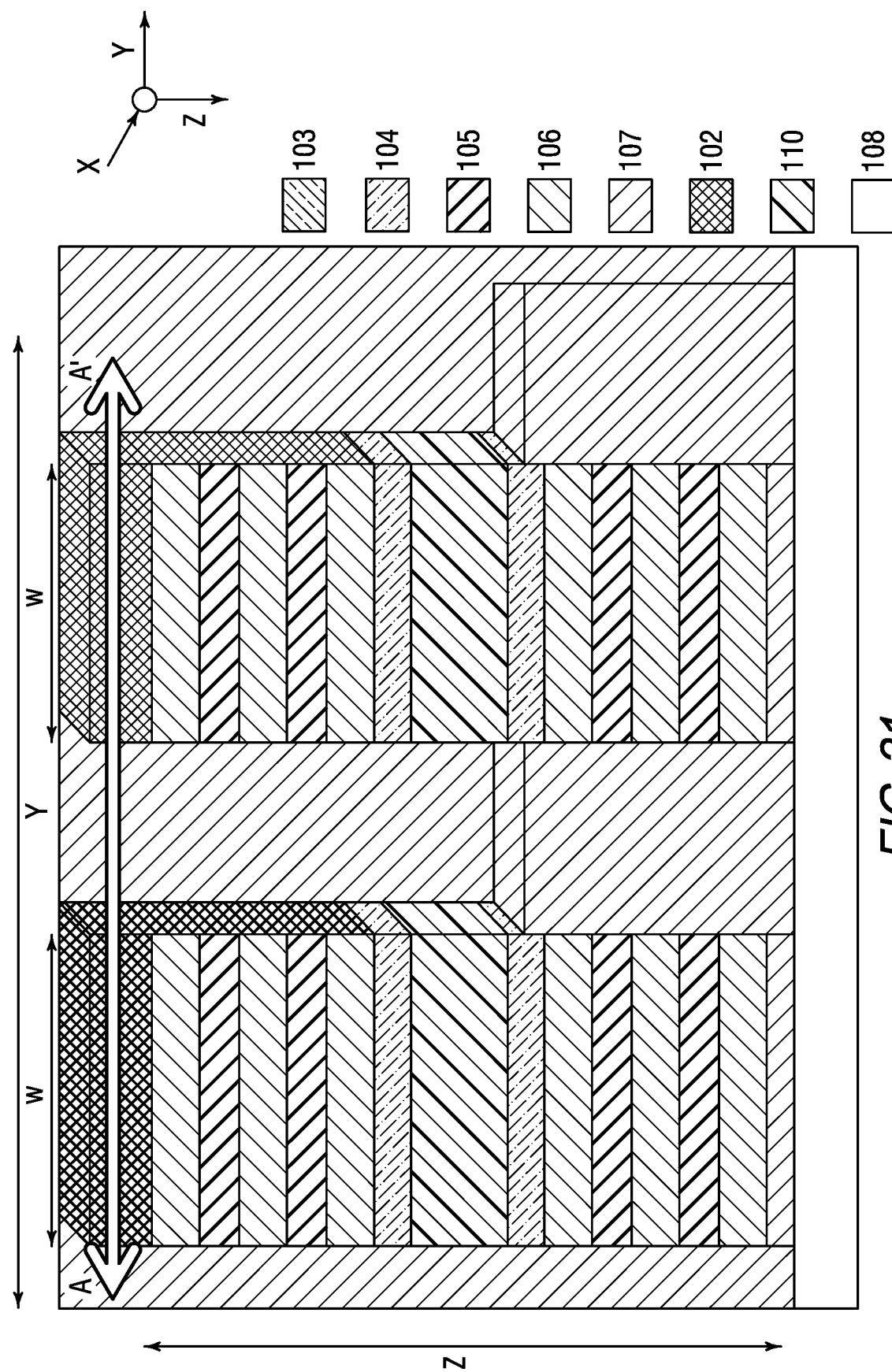
Figure 22:
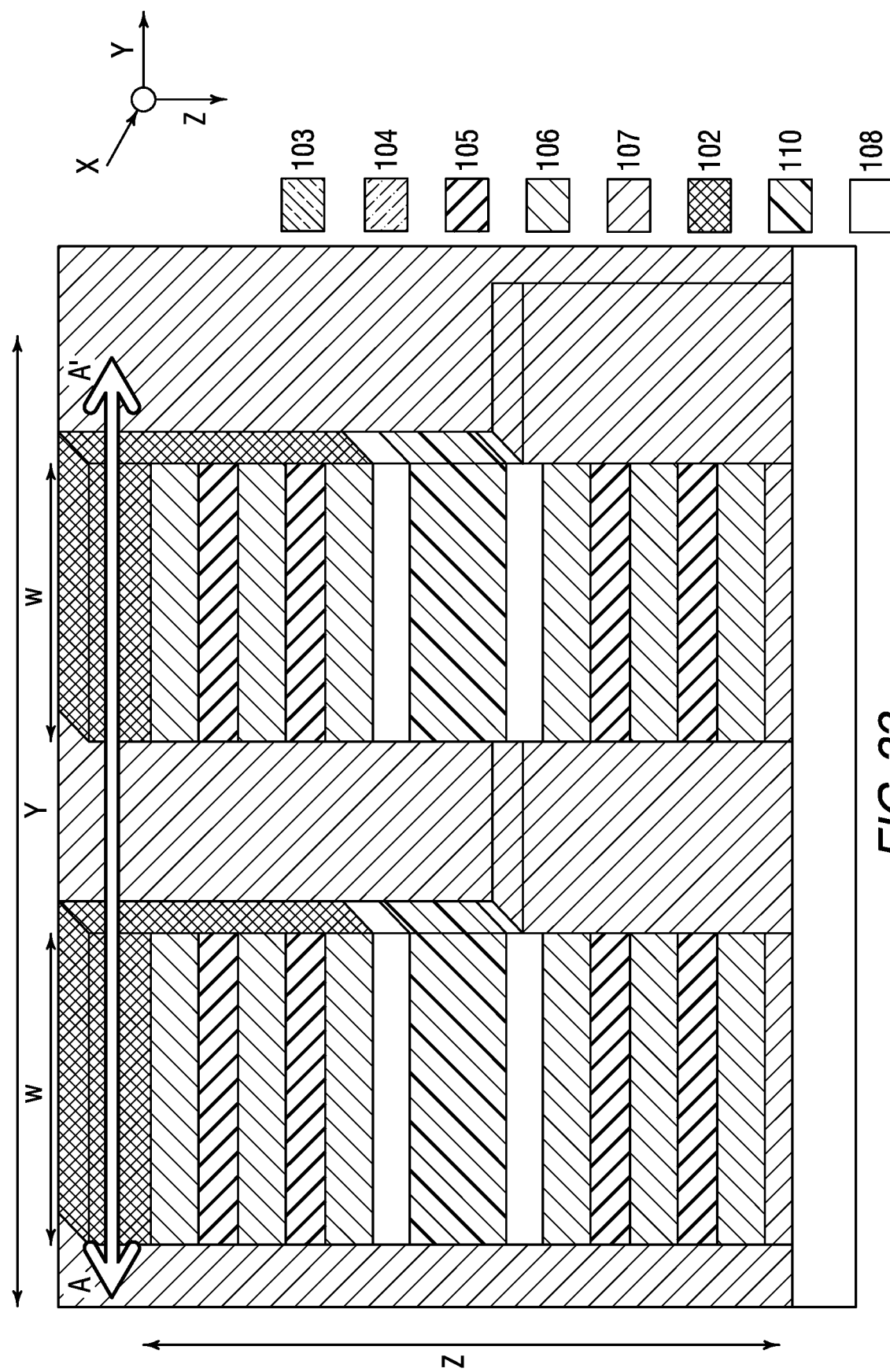
Figure 23:
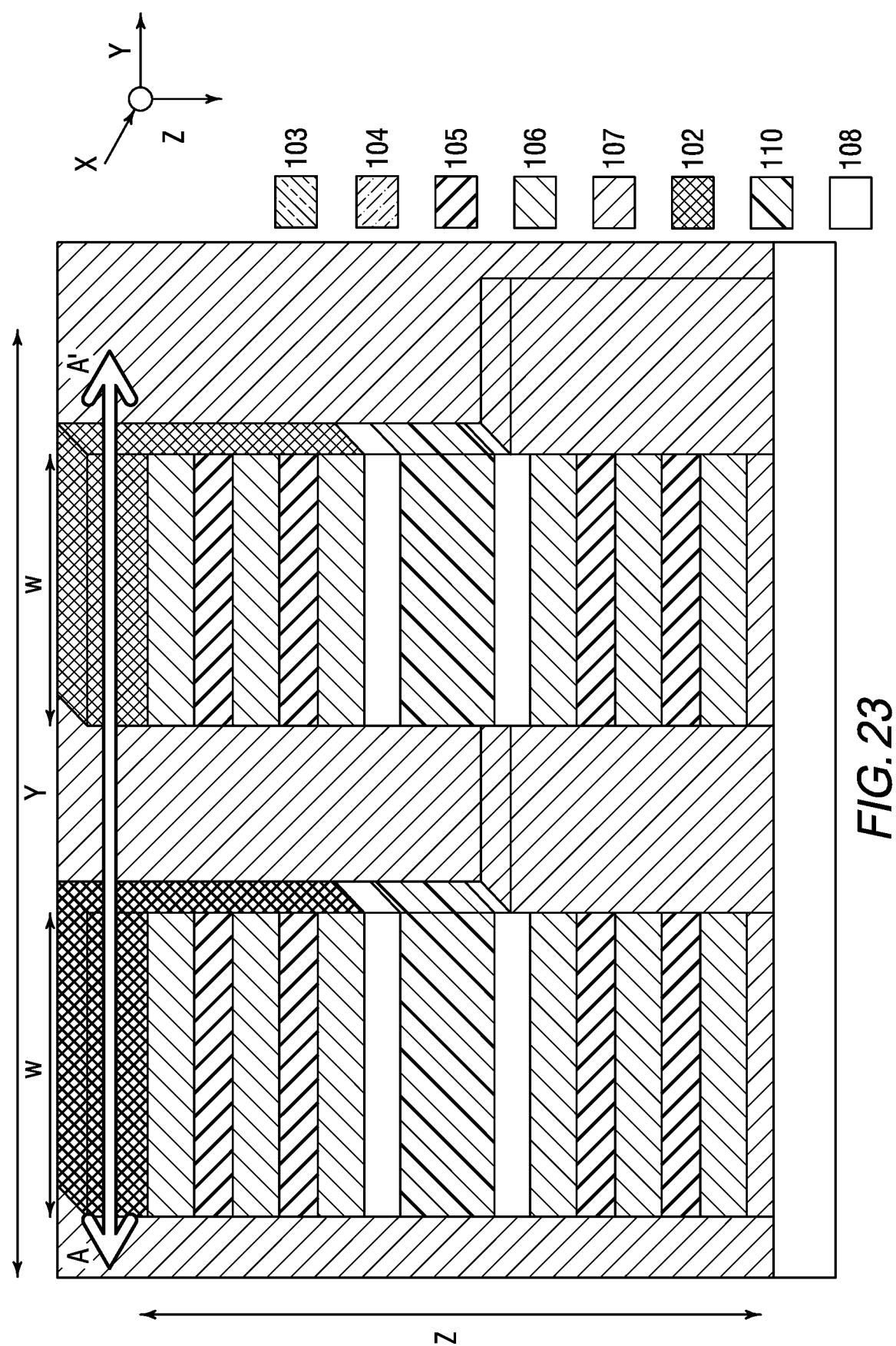

SiX5 can then be removed, similar to the SiX4 removal (FIG. 14). SiX5 is then replaced with a dielectric such as oxide 107, which can also fill spaces between stacks (FIG. 15). This completes the replacement of epitaxial materials with metal and dielectric for one portion of the nano-sheet stacks. These steps are then repeated for the portion of stacks covered by the oxide and the initial etch mask. FIG. 16 illustrates a final cross section of the device. Note that a metal line of Ru or other conductor is located in the center of the nano-sheet stack isolated by a dielectric from other silicon planes.

Figure 24:
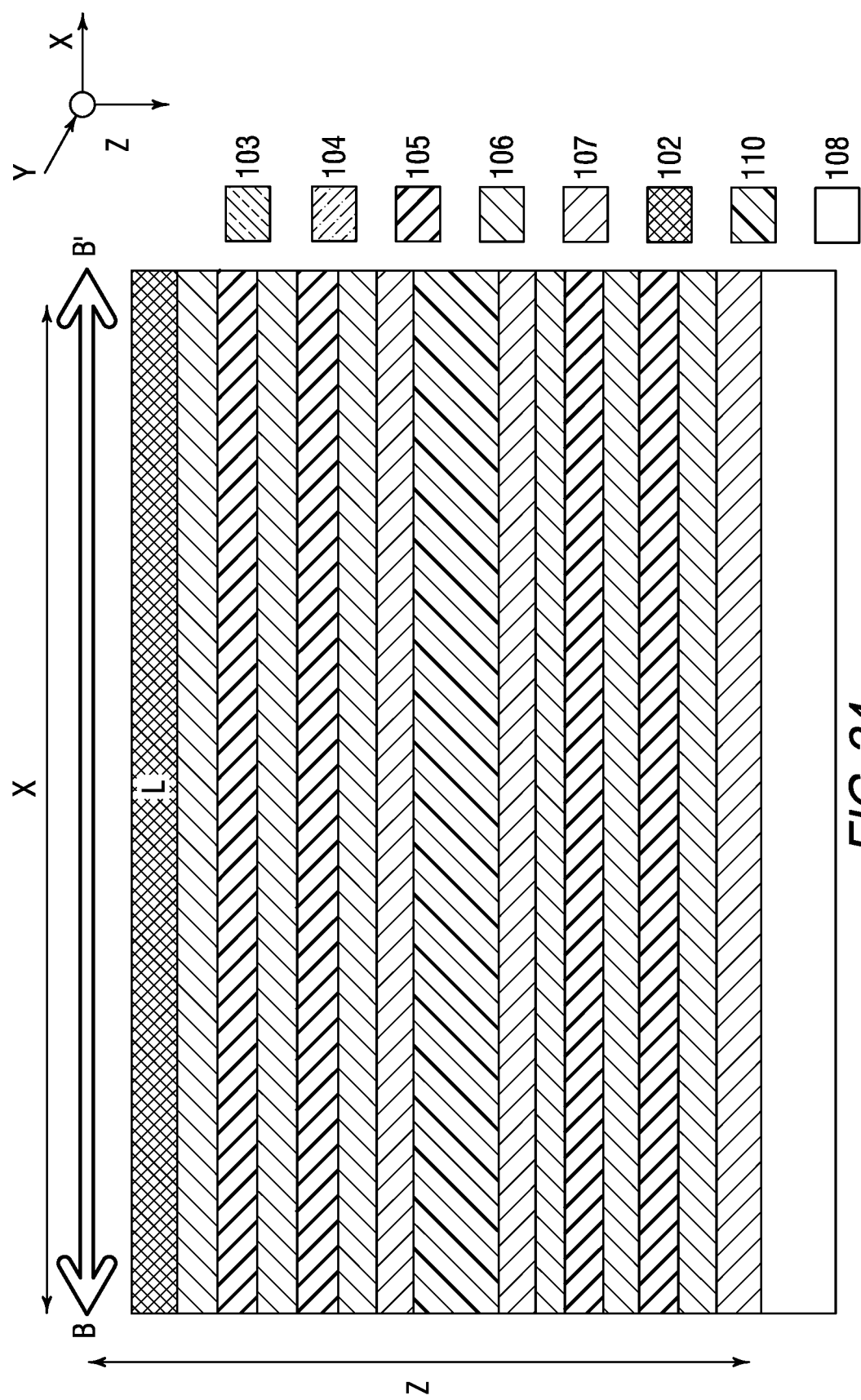

FIGS. 17-24 illustrate one alternative embodiment in which uncovered oxide 107 (not covered by an etch mask) is partially etched, that is, recessed sufficiently to uncover the replacement metal layer and replacement dielectric layer. Thus, oxide 107 can remain covering nano-sheets below the SiX4 and SiX5 nano-sheets. This embodiment can assist with metal replacement or efficiency of metal replacement. Leaving oxide filling the space between the lower nano-sheets means that less metal needs to be used to fill the substrate, which in turn means less metal overburden to be polished and etched away. FIG. 24 shows a similar final cross section of the device as above.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures.

The invention claimed is:

1. A method of fabricating a semiconductor device, the method comprising:
    forming a nano-sheet stack on a substrate, the nano-sheet stack being a stack of multiple layers of four or more different materials, the nano-sheet stack having an elongated geometry along a first direction perpendicular to a vertical direction, nano-sheets within the nano-sheet stack formed by epitaxial growth, a vertically central portion of the nano-sheet stack having a first layer of a first material in contact with second layers of a second material positioned above and below the first layer in the vertical direction, a lower portion of the nano-sheet stack and an upper portion of the nano-sheet stack in the vertical direction both having alternating layers of a third material and a fourth material, each of the four or more different materials having a different etch resistivity relative to each other;
    along the first direction, masking a first portion of the nano-sheet stack while a second portion of the nano-sheet stack is uncovered;
    replacing uncovered portions of the first material with a conductor;
    replacing uncovered portions of the second material with a dielectric;
    along the first direction, masking the second portion of the nano-sheet stack while the first portion of the nano-sheet stack is uncovered;
    replacing uncovered portions of the first material with the conductor; and
    replacing uncovered portions of the second material with the dielectric.

2. The method of fabricating a semiconductor device, according to claim 1, wherein
    the first material and the second material are $Si_xGe_y$, with x being between 0.10 and 0.25 and y being between 0.75 and 0.90.

3. The method of fabricating a semiconductor device, according to claim 1, wherein
    the first material and the second material are pure germanium, $Ge_xSn_y$, or $Si_xC_y$.

4. The method of fabricating a semiconductor device, according to claim 1, wherein
    the conductor is ruthenium (Ru).

5. The method of fabricating a semiconductor device, according to claim 1, wherein
    the dielectric is oxide.

6. The method of fabricating a semiconductor device, according to claim 1, wherein
    the third material is silicon and the fourth material is $SiGe_2$.

7. The method of fabricating a semiconductor device, according to claim 1, further comprising:
    forming an oxide on the substrate below the nano-sheet stack and forming a nitride cap on the top of the nano-sheet stack, in the vertical direction.

8. A method of fabricating a semiconductor device, the method comprising:
    forming a nano-sheet stack on a substrate, the nano-sheet stack being a stack of multiple layers of four or more different materials, the nano-sheet stack having an elongated geometry along a first direction perpendicular to a vertical direction, nano-sheets within the nano-sheet stack formed by epitaxial growth, a vertically central portion of the nano-sheet stack having a first layer of a first material in contact with second layers of a second material positioned above and below the first layer in the vertical direction, a lower portion of the nano-sheet stack and an upper portion of the nano-sheet stack in the vertical direction both having alternating layers of a third material and a fourth material, each of the four or more different materials having a different etch resistivity relative to each other;
    along the first direction, masking a first portion of the nano-sheet stack while a second portion of the nano-sheet stack is uncovered;
    partially etching uncovered portions of the first material;
    replacing the partially etched uncovered portions of the first material with a conductor;
    partially etching uncovered portions of the second material;
    replacing the partially etched uncovered portions of the second material with a dielectric;
    along the first direction, masking the second portion of the nano-sheet stack while the first portion of the nano-sheet stack is uncovered;
    partially etching uncovered portions of the first material;
    replacing the partially etched uncovered portions of the first material with the conductor;
    partially etching uncovered portions of the second material;
    replacing the partially etched uncovered portions of the second material with the dielectric.

9. The method of fabricating a semiconductor device, according to claim 8, wherein
    the first material and the second material are $Si_xGe_y$, with x being between 0.10 and 0.25 and y being between 0.75 and 0.90.

10. The method of fabricating a semiconductor device, according to claim 8, wherein
the first material and the second material are pure germanium, $Ge_xSn_y$, or $Si_xC_y$.

11. The method of fabricating a semiconductor device, according to claim 8, wherein
the conductor is ruthenium (Ru).

12. The method of fabricating a semiconductor device, according to claim 8, wherein
the dielectric is oxide.

13. The method of fabricating a semiconductor device, according to claim 8, wherein
the third material is silicon and the fourth material is $SiGe_2$.

14. A semiconductor device comprising:
a substrate;
an oxide layer deposited on the substrate;
a nano-sheet stack formed on top of the oxide layer; and
a nitride cap formed on top of the nano-sheet stack, wherein the nano-sheet stack is a stack of multiple layers of four or more different materials, the nano-sheet stack having an elongated geometry along a length direction perpendicular to a vertical direction and a shortened geometry along a width direction perpendicular to each of the vertical direction and the length direction,
a vertically central portion of the nano-sheet stack has a first layer of a conductor material in contact with second layers of a dielectric material positioned above and below the first layer of conductor material in the vertical direction, and
a lower portion of the nano-sheet stack and an upper portion of the nano-sheet stack in the vertical direction both have alternating layers of a third material and a fourth material, and the first layer of conductor material extends along the nanosheet stack along the entire width direction.

15. The semiconductor device, according to claim 14, wherein the nano-sheet stack is formed by epitaxial growth.

16. The semiconductor device, according to claim 14, wherein the third material is silicon and the fourth material is $SiGe_2$.

17. The semiconductor device, according to claim 14, wherein the conductor is ruthenium (Ru).

18. The semiconductor device, according to claim 14, wherein the dielectric is oxide.

* * * * *